US007693676B1

(12) United States Patent
Keller et al.

(10) Patent No.: US 7,693,676 B1
(45) Date of Patent: Apr. 6, 2010

(54) LOW POWER SCAN TEST FOR INTEGRATED CIRCUITS

(75) Inventors: Brion L. Keller, Binghamton, NY (US);
Vivek Chickermane, Ithaca, NY (US);
Sandeep Bhatia, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 142 days.

(21) Appl. No.: 11/704,443

(22) Filed: Feb. 9, 2007

Related U.S. Application Data

(63) Continuation of application No. 11/518,339, filed on Sep. 8, 2006, now abandoned.

(51) Int. Cl.
*G01R 27/28* (2006.01)
(52) U.S. Cl. .................. 702/118; 702/119; 702/120; 714/728; 714/739
(58) Field of Classification Search ............. 702/81–84, 702/117–120, 123–126; 700/108–111; 714/726–729, 714/738, 739
See application file for complete search history.

(56) References Cited

U.S. PATENT DOCUMENTS

| | | | |
|---|---|---|---|
| 4,687,988 A * | 8/1987 | Eichelberger et al. ...... 324/73.1 |
| 6,779,163 B2 | 8/2004 | Bednar et al. | |
| 6,820,240 B2 | 11/2004 | Bednar et al. | |
| 6,883,152 B2 | 4/2005 | Bednar et al. | |
| 7,277,803 B2 * | 10/2007 | Thirunavukarasu et al. ... 702/57 |
| 2005/0240887 A1 * | 10/2005 | Rajski et al. .................. 716/4 |
| 2007/0094561 A1 * | 4/2007 | Udell et al. ................. 714/738 |

OTHER PUBLICATIONS

Bhunia, S. et al. (Mar. 2005). "Low-Power Scan Design Using First-Level Supply Gating," *IEEE Transactions on Very Large Scale Integration (VLSI) Systems* 13(3):384-395.
Bonhomme, Y. et al. (Jul. 9-11, 2001). "A Gated Clock Scheme for Low Power Scan-Based BIST," *Proceedings Seventh International On-Line Testing Workshop*: Giardini Naxos, Taormina, Italy, pp. 87-89.
Hatami, S. et al. (May 23-26, 2005). "A Low-Power Scan-Path Architecture," *Conference Proceedings of IEEE International Symposium on Circuits and Systems (ISCAS)*: Kobe, Japan, pp. 5278-5281.
Yoshida, T. et al. (Nov. 18-20, 2002). "MD-Scan Method for Low Power Scan Testing," *Proceedings of the 11th Asian Test Symposium (ATS'02)*: Guam, USA, 6 pages.

* cited by examiner

*Primary Examiner*—Manuel L Barbee
(74) *Attorney, Agent, or Firm*—Duane Morris LLP

(57) ABSTRACT

Low power design is a critical concern and metric for integrated circuits. During scan based manufacturing test, electric power dissipation becomes even more critical as the chip may not have been designed to tolerate excessive switching during scan test. Excessive electric power dissipation during scan test can result in excessive voltage variations, reduced noise margins and other signal integrity issues which could invalidate the test or may lead to premature chip failure. Power dissipation during test is minimized by selecting particular values for the unused care-bits in values of the test vectors on a probabilistic basis to minimize switching, while preserving test vector quality.

31 Claims, 1 Drawing Sheet

LOW POWER SCAN TEST FOR INTEGRATED CIRCUITS

CROSS REFERENCE TO RELATED APPLICATIONS

This non-provisional application claims priority to U.S. patent application Ser. No. 11/518,339 filed Sep. 8, 2006 the entire contents of which are hereby incorporated by reference.

FIELD OF THE INVENTION

This invention relates to design and testing of circuits, including design and testing of integrated circuits.

BACKGROUND

Electric power dissipation in advanced ICs (integrated circuits) has become critical for a number of reasons. Consumer electronics used in battery-operated devices may have a requirement to minimize power to prolong battery life. Excessive power consumption in other complex ICs can cause heat dissipation issues requiring special cooling infrastructure that adds to the system cost. Hence various IC design techniques are commonly used to limit the power consumed during normal operation of the chip, such as clock gating, dynamic voltage and frequency scaling (DVFS), and power shut-off (PSO).

This invention relates to design, testing and simulation of semiconductor devices including testing of integrated circuits (chips). The electric power rails (conductors) in the chip are normally designed, per the chip specification, for maximum power dissipation during functional operation mode (the actual IC use). However, during manufacturing test of the IC/die/wafer, the various power saving techniques employed in the chip under test may be turned off to enable full chip testing. For example, clock gating logic may be disabled and bypassed, and the chip's power-shut-off logic may be disabled to allow full chip test at system frequency for delay testing. ATPG (automatic test pattern generation) scan test patterns (the applied test signals, also known as test vectors) generally lead to much more switching in the IC than during the functional mode, especially during the scan shift operation, due to the way most ATPG tools (software) create test patterns. As a result, the chip may undesirably exceed its limit of power consumption (either average or instantaneous) during manufacturing test.

It is common practice to lower the test clock frequency during scan shift operation to help reduce average power consumption. However, since all test scan registers on-chip more or less shift (switch) simultaneously during scan shift operation, the instantaneous peak electric current drawn may still exceed the limit of the power rails and result in signal and power integrity issues, such as ground bounce and power variation, dI/dt (change of current over time) threshold exceeded, etc. This can invalidate the test and lead to test failure, affecting the manufacturing yield. Power consumption during manufacturing test of digital integrated chips (IC's) thus is an important consideration. Due to high switching activity during scan based manufacturing test, the power consumption may exceed the thermal limit or power-supply limit of the chip-causing failure of the test due to ground-bounce or other related issues, or even premature failure of the chip due to excessive heat generation.

SUMMARY

The Encounter™ RTL (Register Transfer Level) Compiler commercially available from Cadence Design Inc. is a software tool for IC design and simulation and has several low power design features that may be used to optimize functional mode power consumption, such as multi-Vt mapping, automatic clock gating, multi-voltage islands, and power shutoff. In addition, this RTL Compiler has power analysis features that help chip designers estimate power consumption early in the chip design cycle.

This power analysis is improved as described here to estimate power dissipation during manufacturing test application, specifically for scan shift operation. (The scan registers are on-chip memory elements conventionally provided on-chip for test purposes.) This is achieved by using the Cadence Design commercially available Encounter True-Time Test (ETT) ATPG tool to generate manufacturing test patterns (test vectors), and estimate power consumption based on the switching profile of the test patterns and desired test-mode clock frequency, which may be different from the functional mode clock frequency. This allows the chip designer to understand the power requirements during manufacturing test operation, and guides the chip architecture to keep the power consumption during test within the desired limits. Alternatively, designers can use advanced ATPG options to create inherently low power test patterns, and estimate up-front if those patterns would meet the chip power consumption limit.

If the designer is not using the ETT ATPG tool, test patterns from other ATPG tools may be supplied in the same format as the ETT ATPG tool for power analysis by the RTL compiler. Alternatively, the designer can extract and supply the scan register switching profile for the target test patterns and estimate the power consumption in scan mode based on the switching profile. Use of the RTL Compiler and/or ETT ATPG tool are not required in accordance with the invention.

Automatic test pattern generation (ATPG) tools (software), such as the ETT ATPG, typically generate test patterns (also called "vectors" which are a predetermined sequence of binary values and which are applied as binary electrical signals to relevant parts—e.g., gates or transistors—of the device under test) by determining a few of the bits in the test vector for scan registers and primary inputs. The number of ATPG specified bits may be as low as about 0.5% of the total bits in a particular test vector. The usage range is 0.5% to 3%, about 1% being the medium value. The remainder of the test vector bits are conventionally filled in randomly—or based on some other heuristic to get a complete vector—which is then fault simulated.

This disclosure is directed to generation of suitable low power test vectors by filling of the unspecified bits so as to minimize chip switching activity due to the scan-in operation, while maintaining the quality of the test vectors. Moreover, in one embodiment the present method allows one to simulate test vectors and estimate resulting power consumption at a very early phase of IC design such as during the RTL specification phase. This is well before final chip implementation, fabrication, or actual chip testing. This allows designers and design planners to do early power consumption forecasting, virtual IC prototyping, and ensures provision of proper chip cooling of the tester equipment during actual manufacturing testing.

DETAILED DESCRIPTION

Figure 1:
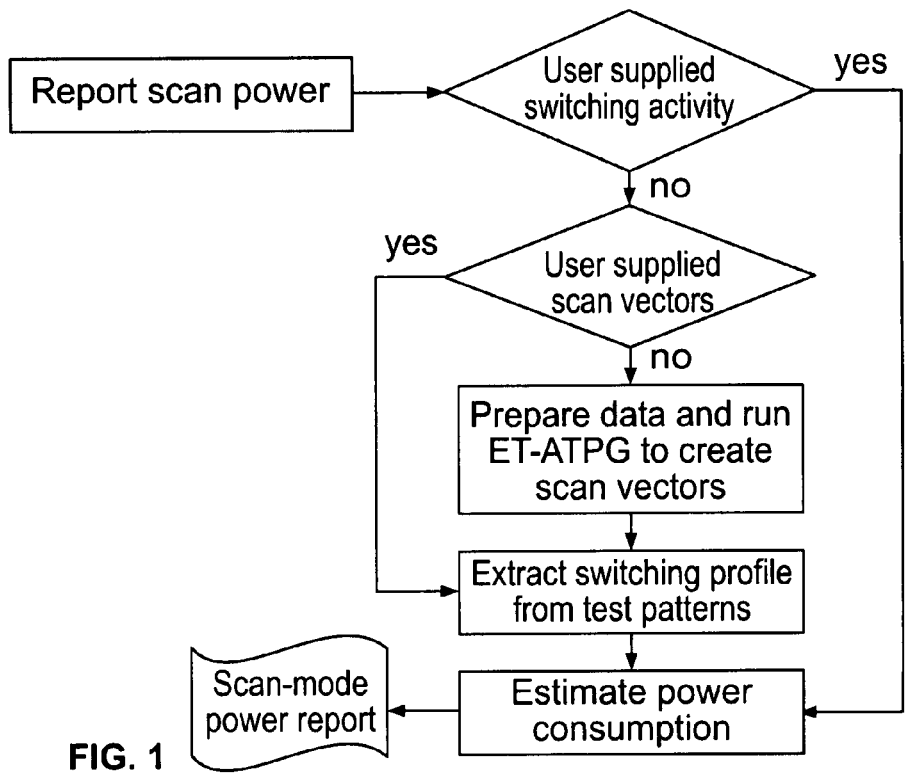
FIG. 1 shows the process for the "report scan-power" command as a flowchart.

This disclosure relates in part to the Common Power Format, which is a known circuit design tool (software) directed towards design of low power circuits, including testing thereof, and especially intended for circuits having complex power domains and operating modes. See also U.S. patent application Ser. No. 11/489,384, filed Jul. 18, 2006, title "Method and System for Simulating State Retention of an RTL Design, Yonghao CHEN, and No. 11/489,385, filed Jul. 18, 2006, title "Simulation of Power Domain Isolation", Yonghao CHEN, both incorporated herein by reference in their entireties. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Some portions of the description that follows are presented in terms of pseudo-code or flowcharts, or logic blocks, or other symbolic representations of operations on information that can be performed on a computer system. A procedure, computer-executed step, logic block, process, etc., is here conceived to be a self-consistent sequence of one or more steps or instructions leading to a desired result. The steps are those utilizing physical manipulations of physical quantities. These quantities can take the form of electrical, magnetic, or radio signals capable of being stored, transferred, combined, compared, and otherwise manipulated in a computer system. These signals may be referred to at times as bits, values, elements, symbols, characters, terms, numbers, or the like. Each step may be performed by hardware, software, firmware, or combinations thereof.

In one embodiment, a system for simulating an integrated circuit is conventionally implemented using a conventional computer system. The computer system includes one or more central processing units (CPUs), at least a user interface, a memory device, a system bus, and one or more bus interfaces for connecting the CPU, user interface, memory device, and system bus together. The computer system also includes at least one network interface for communicating with other devices on a computer network. In alternative embodiments, much of the functionality of the circuit simulator may be implemented in one or more application-specific integrated circuits or field-programmable gate arrays, thereby either eliminating the need for a CPU, or reducing the role of the CPU in simulating the integrated circuit.

The memory device may include a high-speed random access memory or may also include a non-volatile memory, such as one or more magnetic disk storage devices. The memory device may also include mass storages that are remotely located from the central processing unit(s). The memory device preferably stores:

- an operating system that includes procedures for handling various basic system services and for performing hardware-dependent tasks;
- a register-transfer-level (RTL) netlist describing the integrated circuit to be simulated;
- a circuit elaborator for compiling the RTL netlist to form a hierarchical simulation data structure;
- a hierarchical simulation data structure that represents a data structure of the integrated circuit design to be simulated;
- a power information database; and
- a circuit simulator that simulates the integrated circuit represented by the simulation data structure with power information specifications provided by the power information database.

Note that the circuit elaborator also instantiates circuit components, connects the circuit components, and sets up run-time simulation elements of the integrated circuit design. In addition, the hierarchical simulation data structure represents the integrated circuit design as a hierarchically arranged set of branches, including a root branch and a plurality of other branches logically organized in a graph. The hierarchically arranged set of branches includes a first branch that includes one or more circuit elements and a second branch that includes one or more circuit elements where the first branch and second branch are interconnected in the graph through a third branch at a higher hierarchical level in the graph than the first and second branches. Also note that an RTL netlist description of an integrated circuit may be written in either the Verilog or VHDL design language.

The circuit elaborator, simulation data structure, circuit simulator, power information database, and the RTL netlist may include executable procedures, sub-modules, tables, and other data structures. In other embodiments, additional or different modules and data structures may be used, and some of the modules and/or data structures listed above may not be used.

In accordance with the present invention, since the design intent, power constraint, and/or technology library information are embedded within the CPF (Common Power Format) file in some embodiments, verification and sign-off processing are possible even at the functional stage. In fact, the information can be used throughout the entire software flow to more efficiently and effectively allow the circuit designer to design, verify, and physically implement the design.

The ATPG based power estimation process is as described here in one embodiment fully automated and transparent to the end user (designer) in terms of configuring and running ATPG, extracting switching activity from test patterns, and estimating and reporting estimated power consumed during scan shift operation the RTL Compiler environment. This is achieved in one embodiment by the RTL Compiler software command report scan_power:

report scan_power [-clock float]
        [-flop flop_switching_activity
        |-scan_vectors file_name
        |-atpg [-atpg_options string]]
        [-library string] [>file}

FIG. 1 depicts the flow of this command as carried out by the RTL Compiler (or any similar software). Note that preparing the necessary script (program) and data to run ETT ATPG is fully automated and is transparent to the end user. This is used, in one embodiment, to generate the test vectors as described here, but is not the only way to do so. ETT ATPG, by default, generates the most efficient test patterns without limiting the switching activity during scan testing. It also has a low power mode where the switching activity during scan is set to be absolute minimal, thus greatly reducing power consumed during scan test. However, in general this can undesirably result in an increase in the number of total test patterns required to achieve the target fault coverage, and increased computer runtime to generate those test patterns.

During scan mode power estimation from the RTL Compiler, the user can instruct the ETT ATPG tool to select the desirable test patterns—normal test patterns that are generated by default, or low-power test patterns, using the -atpg_options option (command). The ATPG option that generates low power vectors is -atpg_options latchfill=repeat. Under this option, ATPG tries to create test patterns that have reduced 0 to 1 or 1 to 0 transitions along the scan shift path, as described further below. This reduces the chip's switching activity—and hence the power consumed—during test.

Power consumption during manufacturing test of digital integrated chips (IC's) is thus an important consideration. Due to high switching activity during conventional scan based manufacturing test, the power consumption may exceed the thermal limit or the power-supply limit of the chip—causing failure of the test due to ground-bounce or other related issues, or even premature failure of the chip due to excessive heat generation. Hence it is important to limit both average and peak instantaneous power consumption during test. A typical (conventional) IC test operation requires:
- scanning in test data (the vectors) through scan chains (sequences of registers or other memory elements) to control registers and primary inputs of an IC to a target test pattern or vector
- capturing the response of the IC to the applied test pattern
- scanning out the registers of the IC to observe the response of the IC and comparing it against the expected response.

Since shifting data through scan chains consumes many chip operating cycles during test, it is a critical operation to target for reducing power dissipation. Scan chains are usually shifted at a much slower frequency than during operating mode. Hence average power dissipation during scan shift is not as big a problem as the instantaneous or peak power consumed during scan shift (test mode).

There are a number of existing approaches that address this problem. Some of these techniques are based on IC design changes that limit power consumption during test, such as:
- Gating the clock for scan-chains and scanning data only through a selected few chains at a time, thus, limiting the number of registers changing state in any cycle.
- Gating the output of scan registers during scan operation, thus limiting the switching activity through combinational logic during scan operation.
- Turning off the power to combinational logic while shifting the scan chains.

Typically, when ATPG targets test pattern generation for a chip, it targets a few potential chip manufacturing faults and determines a few bits (care bits) of the required test vector. The majority of the bits in each test vector are then randomly filled, and fault simulated against the entire untested fault set. Any potential fault that is marked detected by the test vector is considered covered or tested by the test vector and is removed from the set of faults targeted for test pattern generation and fault simulation.

In this disclosure, we control the filling of the initially unspecified bits to minimize switching activity. ETT ATPG has an option to repeat-fill all the unspecified bits in a test vector. This is effective in reducing switching activity during scan shift—but at the cost of poor quality of test patterns—and hence may result in an increase in the number of patterns to achieve the target fault coverage. Instead of full repeat-filling of bits, we fill the bits using a probabilistic process, thus achieving a balance between the switching activity and quality of test patterns. So for example, if it is permissible to have 20% of the IC flip-flops (e.g., gates) switching at any time, then we can control the random fill in for each unspecified bit to repeat the previous bit value with a probability of 80%.

Assume a partially specified ATPG vector (sequence) for a chain with 10 bits, where only three of the 10 bits are initially specified ("care bits"), is:

| 0 | X | X | X | 1 | X | X | 0 | X | X |
|---|---|---|---|---|---|---|---|---|---|
| 1 | 2 | 3 | 4 | 5 | 6 | 7 | 8 | 9 | 10 |

"X" represents an unspecified bit, and 0/1 represents the specified bits. Number the bits from 1 through 10 starting from the left most bit (as shown, written just under the bit position). So, using a probabilistic repeat factor of 80% for unspecified bits, we get the following constraints:

Bit 1 is specified by ATPG to be 0

Bit 2 should be the same as bit 1 with a probability of 80%

Bit 3 should be the same as bit 2 with a probability of 80%

Bit 4 should be the same as bit 3 with a probability of 80%

Bit 5 is specified by ATPG to be 1

Bit 6 should be the same as bit 5 with a probability of 80%

Bit 7 should be the same as bit 6 with a probability of 80%

Bit 8 is specified by ATPG to be 0

Bit 9 should be the same as bit 8 with a probability of 80%

Bit 10 should be the same as bit 9 with a probability of 80%.

In one embodiment, the probability factor (e.g., 80% above) is applied using a 0 to 9 random number generator, for instance if the random (decimal) digit generated is 0 to 7, the prior bit value is repeated; if it is 8 or 9, the prior bit value is not repeated. Since the ATPG specified bits are usually a very small proportion of each test vector (less than 3%), this probabilistic method of repeat-filling in bits gives better quality vectors while limiting the switching activity of the test vectors based on the IC being tested. Computer code to carry out the present method is readily written by one of ordinary skill in the art in light of this disclosure.

The RTL Compiler as described above (via simulation) estimates chip power consumption using the switching profile of the IC's flip-flops or gates during scan testing, thus guiding what the appropriate repeat-fill probability should be to stay within the IC's electric power constraints during test mode. A repeat-fill probability of 50% would effectively fill-in the unspecified bits randomly giving the best quality vector from coverage point of view, but also with the most switching. A repeat-fill probability of 100% provides pure repeat on unspecified bits giving the lowest switching activity, but perhaps the poorest quality vectors and requiring many more vectors to achieve desirable test coverage. In accordance with this disclosure, the value of the repeat-fill probability is set at a value between 50% and 100% to get the best quality test vectors while still remaining within the chip power constraints. A typical value is 80%, as shown above. The repeat-fill probability is controlled (determined) based on what test vectors are generated by the ATPG tool and how many bits are filled in by the ATPG tool, so as to keep the switching, and hence the power consumption, during scan shift to under the desired limit. In one embodiment, modifications are made to the ETT ATPG software to support user specification of upper and lower bounds of the repeat-fill. This is done in one example by providing an ETT ATPG tool run-time option for the user (chip designer) specify a limit for the fraction of fill bits that are not repeat-filled. The relevant parameter is:

maxscanswitching=m

Where m specifies the maximum percentage of bits not filled with repeat values, stated as an integer percentage (0 to 100).

Advantages of this method are: there is no need to alter design to target low power consumption during test, it reduces both average power and peak instantaneous power during test, it gives a trade-off between the number of patterns and maximum power consumed during test. Also, it allows one to generate the best quality test vectors while still remaining within the power budget for the IC design, and distributes the switching power during test mode evenly over all the test vectors.

Conventionally, ATPG algorithms attempt to reduce (compact) the total number of test patterns generated, by merging test patterns which do not have conflicting care bit values. For instance, test pattern 01xxx10 can be merged with test pattern x11xx0 since the bit positions having care bits (0 or 1) do not conflict. The merged pattern is 0111-x10. If the ATPG tool user requests the ATPG tool to seek maximum possible compaction, it is possible that the number of unspecified bits (only 1 in this example) is too few to help with test mode power reduction. To support the above "maxscanswitching" parameter, it should prevent merging of test patterns if the resulting merged test pattern would contain more than m percent care bits total. The reason is that in the worst case, each care bit may result in a switched value along the scan path during the shifting in of the test pattern.

Figure 2:
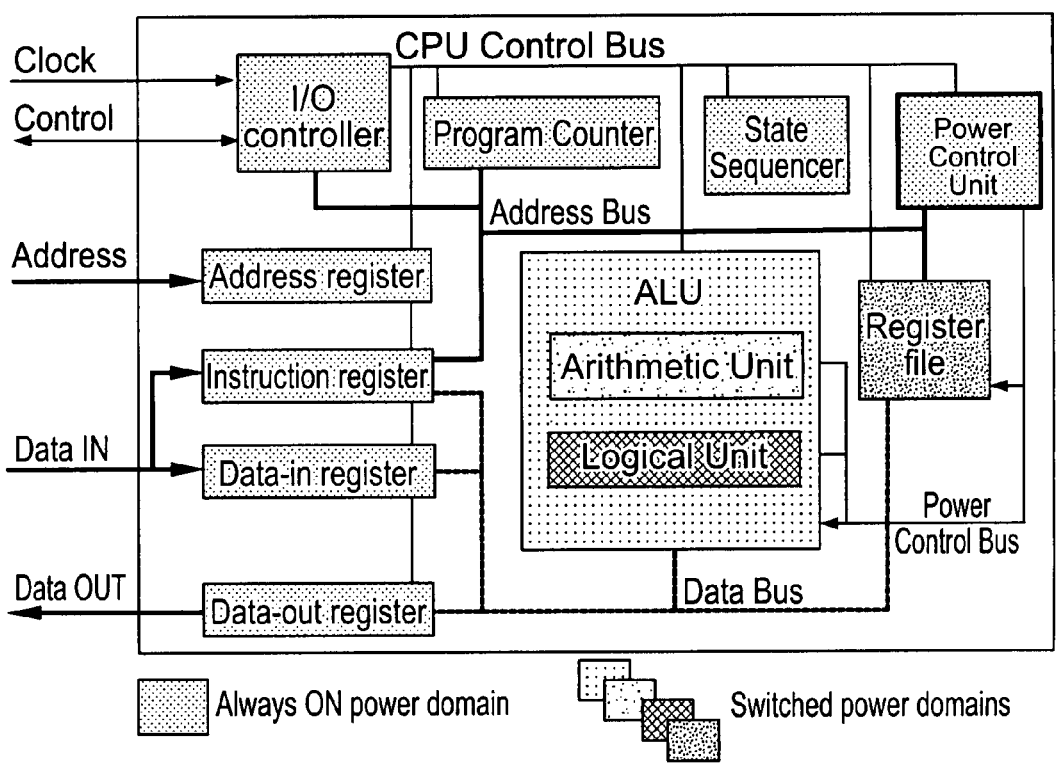
FIG. 2 shows in a block diagram an exemplary IC with power domains.

An experiment was performed on the exemplary IC of FIG. 2 to estimate (by simulation) power consumption during scan test. This IC is a 32 bit RISC style processor with multiple power domains. The IC has about 35K "instances" with about 9K sequential cells. This IC's design of FIG. 2 was mapped to a 90 nM technology library for simulation purposes and the power was estimated for the IC's functional mode at 500 MHz, and scan mode at 50 MHz. For the scan mode power estimation, two different sets of ATPG patterns were used regular patterns that had about 46% switching activity, and low power mode patterns that had about 6% switching activity on the scan chain flip-flops during scan shift.

Table 1 gives the experimental results of simulated scan mode power dissipation for the FIG. 21C. In the first column, the modes of operation are listed. Column 2 lists the clock frequency for each mode. Column 3 lists the estimated switching power as calculated by the RTL Compiler. The electric power consumption numbers in column 4 are normalized with respect to the functional mode power.

TABLE 1

Experimental results on scan mode power

| Nano CPU | Clock freq. (MHz) | Estimated Switching Power (MW) | normalized |
|---|---|---|---|
| Functional Mode | 500 | 2.95 | 1.00 |
| Scan Mode | 50 | 11.86 | 4.02 |

TABLE 1-continued

Experimental results on scan mode power

| Nano CPU | Clock freq. (MHz) | Estimated Switching Power (MW) | normalized |
|---|---|---|---|
| Normal ATPG patterns Scan Mode Low Power ATPG patterns | 50 | 1.66 | 0.56 |

Note that the functional mode power consumption while clocking the IC at 500 MHz is only about 3 mW, while in the scan mode, even when clocking at a much lower frequency of 50 MHz, the power consumption is four times the functional mode power. If ATPG targets low power test patterns, then the test mode power consumption drops to about 56% of that of the functional mode. Thus the experiment indicates that scan mode power may be an issue for this IC unless the ATPG tool can determine the low power test patterns. Low power ATPG patterns do come at a cost. In this case the low power ATPG patterns requires about 23% more test vectors and about 20% increased computer time for ATPG (generating the test patterns) as compared to conventional ATPG patterns. However, the same fault coverage of 99.7% was achieved in both cases.

The above shows that it is important to understand and estimate scan-mode power consumption as it may be much higher than the normal functional mode power, even when the IC is clocked at a lower frequency for scan-mode. Higher power consumption can lead to test invalidation or chip failure. Having the ability to quickly estimate power consumption in test mode while still at early stages of IC design can save expensive re-designs at a later stage to address these power issues. ATPG can help reduce power consumption during scan mode if it targets low power vectors. The Encounter RTL Compiler in one embodiment provides the support to run the ETT ATPG tool in different power modes and estimate the power dissipation during test scan mode for different ATPG patterns from within the synthesis (design) environment. This achieves controllable repeat fill of unspecified bits in ATPG patterns to reduce power during scan shift using a probability based method. It also controls the trade-off between number of patterns and maximum power consumed during test. It also allows one to generate the best quality test vectors while still remaining within the power constraints for the IC design.

This disclosure is illustrative and not limiting. Further embodiments will be apparent to one skilled in the art in light of this disclosure, and are intended to fall within the scope of the invention as defined by the appended claims.

We claim:

1. A method of testing an integrated circuit, comprising the acts of:
   determining at least one test pattern to be applied to the integrated circuit, the test pattern including a sequence of binary values, wherein only particular ones of the values are specified for testing, remaining ones of the values initially being unspecified;
   determining each of the unspecified values by setting each unspecified value as being equal to the immediately preceding value in the sequence at a predetermined probability greater than 0.5 and less than 1, each unspecified value otherwise being an inverse of the immediately preceding value;
   applying the test pattern to the integrated circuit; and
   determining a resulting state of the integrated circuit.

2. The method of claim 1, wherein the probability is applied using a random number generator.

3. The method of claim 1, wherein the probability is greater than 0.7 and less than 0.9.

4. The method of claim 1, wherein the probability is selected to minimize a number of such test patterns required so as to test substantially all faults on the integrated circuit.

5. The method of claim 1, wherein the probability is selected to minimize power consumption by the integrated circuit during testing.

6. The method of claim 1, wherein the probability is selected to minimize the number of test patterns required while staying within a predetermined electric power constraint.

7. The method of claim 1, wherein the integrated circuit includes a plurality of scan elements, and the act of determining the resulting state of the integrated circuit includes determining a state of each scan element.

8. The method of claim 1, further comprising the acts of:
determining a plurality of the test patterns;
merging the plurality of the test patterns; and
restricting the merging if the merged test pattern has more than a predetermined proportion of specified values.

9. The method of claim 1, further comprising: restricting a non-repetition of the unspecified values if a proportion of non-repeating unspecified values reaches a pre-determined limit.

10. A computer readable medium storing computer code for carrying out a method of testing an integrated circuit, the method comprising:
determining at least one test pattern to be applied to the integrated circuit, the test pattern including a sequence of binary values, wherein only particular ones of the values are specified for testing, remaining ones of the values initially being unspecified;
determining each of the unspecified values by setting each unspecified value as being equal to the immediately preceding value in the sequence at a predetermined probability greater than 0.5 and less than 1, each unspecified value otherwise being an inverse of the immediately preceding value;
applying the test pattern to the integrated circuit; and
determining a resulting state of the integrated circuit.

11. The computer readable medium of claim 10, wherein the method further comprises:
determining a plurality of the test patterns;
merging the plurality of the test patterns; and
restricting the merging if the merged test pattern has more than a predetermined proportion of specified values.

12. The computer readable medium of claim 10, wherein the method further comprises: restricting a non-repetition of the unspecified values if a proportion of non-repeating unspecified values reaches a pre-determined limit.

13. A method of simulating an integrated circuit, comprising the acts of:
determining at least one test pattern to be applied to the integrated circuit when it is being tested, the test pattern including a sequence of binary values, wherein only particular ones of the values are specified for testing, the remaining ones of the values initially being unspecified;
determining each of the unspecified values by setting each unspecified value as being equal to the immediately preceding value in the sequence at a predetermined probability greater than 0.5 and less than 1, each unspecified value otherwise being an inverse of the immediately preceding value;
using a computer for simulating testing of the integrated circuit by applying the test pattern to a simulation of the integrated circuit; and
determining from the simulating how much electrical power the integrated circuit would dissipate during the testing.

14. The method of claim 13, wherein the probability is applied using a random number generator.

15. The method of claim 13, wherein the probability is greater than 0.7 and less than 0.9.

16. The method of claim 13, wherein the probability is selected to minimize a number of such test pattern required so as to find substantially all faults on the integrated circuit.

17. The method of claim 13, wherein the probability is selected to minimize power consumption by the integrated circuit during testing.

18. The method of claim 13, wherein the probability is selected to minimize the number of test patterns required while staying within a predetermined electric power constraint.

19. The method of claim 13, wherein the integrated circuit includes a plurality of scan elements, and the act of determining from the simulating how much electrical power the integrated circuit would dissipate during the testing includes determining a state of each scan element.

20. The method of claim 13, further comprising the acts of:
determining a plurality of the test patterns;
merging the plurality of test patterns; and
restricting the merging if the merged test pattern has more than a predetermined proportion of specified values.

21. The method of claim 13, wherein the method precedes at least one of final integrated circuit implementation, fabrication, and actual testing.

22. The method of claim 13, further comprising: restricting a non-repetition of the unspecified values if a proportion of non-repeating unspecified values reaches a pre-determined limit.

23. A computer readable medium storing computer code for carrying out a method of simulating an integrated circuit, the method comprising:
determining at least one test pattern to be applied to the integrated circuit when it is being tested, the test pattern including a sequence of binary values, wherein only particular ones of the values are specified for testing, the remaining ones of the values initially being unspecified;
determining each of the unspecified values by setting each unspecified value as being equal to the immediately preceding value in the sequence at a predetermined probability greater than 0.5 and less than 1, each unspecified value otherwise being an inverse of the immediately preceding value;
simulating testing of the integrated circuit by applying the test pattern to a simulation of the integrated circuit; and
determining from the simulating how much electrical power the integrated circuit would dissipate during the testing.

24. The computer readable medium of claim 23, wherein the method further comprises:
determining a plurality of the test patterns;
merging the plurality of test patterns; and
restricting the merging if the merged test pattern has more than a predetermined proportion of specified values.

25. The computer readable medium of claim 23, wherein the method further comprises: restricting a non-repetition of the unspecified values if a proportion of non-repeating unspecified values reaches a pre-determined limit.

26. An apparatus comprising a computer system that executes computer instructions for carrying out a method of testing an integrated circuit, the method comprising:

determining at least one test pattern to be applied to the integrated circuit, the test pattern including a sequence of binary values, wherein only particular ones of the values are specified for testing, remaining ones of the values initially being unspecified;

determining each of the unspecified values by setting each unspecified value as being equal to the immediately preceding value in the sequence at a predetermined probability greater than 0.5 and less than 1, each unspecified value otherwise being an inverse of the immediately preceding value;

applying the test pattern to the integrated circuit; and determining a resulting state of the integrated circuit.

27. The apparatus of claim 26, wherein the method further comprises:

determining a plurality of the test patterns;

merging the plurality of the test patterns; and restricting the merging if the merged test pattern has more than a predetermined proportion of specified values.

28. The apparatus of claim 26, wherein the method further comprises: restricting a non-repetition of the unspecified values if a proportion of non-repeating unspecified values reaches a pre-determined limit.

29. An apparatus comprising a computer system that executes computer instructions for carrying out a method of simulating an integrated circuit, the method comprising:

determining at least one test pattern to be applied to the integrated circuit when it is being tested, the test pattern including a sequence of binary values, wherein only particular ones of the values are specified for testing, the remaining ones of the values initially being unspecified;

determining each of the unspecified values by setting each unspecified value as being equal to the immediately preceding value in the sequence at a predetermined probability greater than 0.5 and less than 1, each unspecified value otherwise being an inverse of the immediately preceding value;

simulating testing of the integrated circuit by applying the test pattern to a simulation of the integrated circuit; and determining from the simulating how much electrical power the integrated circuit would dissipate during the testing.

30. The apparatus of claim 29, wherein the method further comprises:

determining a plurality of the test patterns;

merging the plurality of test patterns; and restricting the merging if the merged test pattern has more than a predetermined proportion of specified values.

31. The apparatus of claim 29, wherein the method further comprises: restricting a non-repetition of the unspecified values if a proportion of non-repeating unspecified values reaches a pre-determined limit.

\* \* \* \* \*